(12) United States Patent
Powell et al.

(10) Patent No.: US 7,820,919 B2
(45) Date of Patent: Oct. 26, 2010

(54) ELECTRONIC CIRCUIT PACKAGES

(75) Inventors: Jeffrey Powell, Malvern (GB); Roger Appleby, Malvern (GB); Mark T Moore, Malvern (GB)

(73) Assignee: Qinetiq Limited (GB)

( * ) Notice: Subject to any disclaimer, the term of this patent is extended or adjusted under 35 U.S.C. 154(b) by 0 days.

(21) Appl. No.: 10/535,684

(22) PCT Filed: Dec. 6, 2004

(86) PCT No.: PCT/GB2004/005121

§ 371 (c)(1),
(2), (4) Date: May 19, 2005

(87) PCT Pub. No.: WO2005/055321

PCT Pub. Date: Jun. 16, 2005

(65) Prior Publication Data

US 2006/0065971 A1  Mar. 30, 2006

(30) Foreign Application Priority Data

Dec. 4, 2003  (GB) .................................. 0328246.4

(51) Int. Cl.
*H05K 9/00* (2006.01)
(52) U.S. Cl. .................. 174/387; 174/559; 257/728
(58) Field of Classification Search .............. 174/350, 174/387, 559; 361/816, 818; 257/728
See application file for complete search history.

(56) References Cited

U.S. PATENT DOCUMENTS

| 4,890,199 A | | 12/1989 | Beutler et al. |
| 5,098,735 A | * | 3/1992 | Henry ............................ 427/8 |
| 5,416,668 A | * | 5/1995 | Benzoni ....................... 361/816 |
| 5,569,879 A | | 10/1996 | Gloton et al. |
| 5,608,188 A | * | 3/1997 | Choon et al. ................. 174/372 |

(Continued)

FOREIGN PATENT DOCUMENTS

GB  2 269 935  2/1994

(Continued)

OTHER PUBLICATIONS

Izzat, N., et al., "Analysis and realisation of low-cost damped screened rooms", IEE Proc. Sci. Meas. Technol. vol. 145, No. 1, Jan. 1998, pp. 1-7.

(Continued)

*Primary Examiner*—Hung V Ngo
(74) *Attorney, Agent, or Firm*—McDonnell Boehnen Hulbert & Berghoff LLP

(57) ABSTRACT

This invention relates to electronic circuit packages designed to hold high frequency circuits operating particularly, but not exclusively, in the microwave, millimeter wave, and sub-millimeter wave bands. The invention provides a package incorporating a cavity in a material for containment of the circuits, wherein the package further incorporates at least one conductive surface mounted on an inner surface extending into the cavity, the conductivity thereof being adapted to be at least partially absorbent to electromagnetic radiation. The conductive surface according to the present invention will tend to attenuate electromagnetic radiation present within the cavity, and so help to prevent undesired coupling from one point to another within the cavity. The conductivity of the conductive material is preferably arranged to match the impedance of the radiation mode estimated or computed to be present within the cavity.

34 Claims, 9 Drawing Sheets

U.S. PATENT DOCUMENTS

| | | |
|---|---|---|
| 6,242,690 B1 | 6/2001 | Glover |
| 6,611,054 B1 | 8/2003 | Dunaway et al. |
| 6,901,660 B2 * | 6/2005 | Miska .................. 29/846 |
| 2002/0029893 A1 | 3/2002 | Toyoda et al. |
| 2002/0067313 A1 | 6/2002 | Kondoh et al. |

FOREIGN PATENT DOCUMENTS

| | | |
|---|---|---|
| GB | 2 279 180 | 12/1994 |
| GB | 2 382 469 | 5/2003 |
| JP | 01 265702 | 10/1988 |
| JP | 02 069995 | 3/1990 |
| JP | 09 223894 | 8/1997 |

OTHER PUBLICATIONS

Izzat, N., et al., "Use of Resistive Sheets in Damping Cavity Resonance", Electronics Letters, vol. 32, No. 8, pp. 721-722, Apr. 11, 1996.

* cited by examiner

% Power Absorbed vs Sheet Resistance at 80 GHz-single Vane

X1 = 59.70GHz
Y1 = 5.54

X1 = 59.70GHz
Y1 = -49.00

ELECTRONIC CIRCUIT PACKAGES

BACKGROUND OF THE INVENTION (1) Field of the Invention

This invention relates to the field of electrical circuit packages, and more specifically to packages for circuits designed to operate at radio frequency, microwave, millimeter wave frequencies, and up into the terahertz waveband. For the purposes of this specification such frequencies will be referred collectively as high frequencies.

(2) Description of the Art

Electrical circuits operating at high frequencies will, due to their nature, often radiate electromagnetic (EM) energy. Such radiation is often unwanted, and can cause problems if the radiation couples into nearby components or circuit board tracks etc, and can lead to unpredictable or unwanted circuit behaviour. For this reason, particularly sensitive parts of a circuit, or those components that are particularly prone to radiate, are frequently packaged in metal or otherwise electrically conductive packages. This can reduce the coupling between circuitry mounted in separate packages, and so alleviate the problem. However, this can sometimes lead to an increased EM coupling within an individual metallic package, leading to a particular sub-circuit mounted within a package to couple back to itself, or to other sub-circuits within the same package.

The problem gets worse as the frequency of operation gets higher, as the EM radiation wavelength will get correspondingly shorter, and hence be closer to a length at which the package itself will be resonant. Resonances can cause strong enhancements in field strengths, and this will tend to result in increased coupling between components, or circuit board tracks, and even between different elements of the same component within the package, which can lead to undesired circuit behaviour generally, and even oscillation if active circuits are involved.

A known solution is to coat the top and/or sides of the package with radiation absorbent material (RAM), or place blocks of RAM into the cavity. RAM is a material having the property that it tends not to reflect incident EM radiation, or allow all the radiation to pass through it. Instead, it is designed to absorb the radiation, effectively dissipating the energy as heat. Some types of these materials are quite thick, as to be effective they need to match the impedance of the radiated wave to the resistance of a dissipative material within the RAM. These are awkward to use in high frequency packages, particularly at the millimeter wave frequencies, due to the size of package required to accommodate the RAM, and the need to fabricate materials with the necessary material parameters.

Other types of RAM are much thinner. Emerson & Cuming Microwave Components manufacture a variety of sheet materials able to act as RAM. Some of these rely upon wavelength dependent effects, and so are inherently narrow band. Other types have a specific resistance that is graded throughout the material thickness to reduce reflections from the surface. These work over a broader bandwidth, but also tend to be thicker. When used in a cavity in which electronic components are mounted the absorption efficiency of these materials tends to reduce as the frequency of operation of the circuitry increases.

U.S. Pat. No. 6,054,766 discloses an electrical circuit package designed to address some of the problems described above. The package disclosed is made in whole or in part of silicon sheets, the sheets having a stated specific conductivity $\sigma$ of between 1 and $10 \Omega^{-1} m^{-1}$. Traditionally, packages for high frequency circuits are often made from a solid piece of aluminium, with cavities milled out to hold the circuits themselves. Thus the disclosure of U.S. Pat. No. 6,054,766 will thus require the traditional packages to be abandoned, or, at best, modified so as to enable the silicon sheeting to be used as described therein.

Monolithic microwave Integrated Circuits (MMICs) operating at several tens of gigahertz have been packaged using the flip-chip technique, whereby the MMIC is flip-chip bonded to a lossy silicon substrate to suppress parasitic modes within the package. This is described in *A Flip-Chip Packaged Coplanar* 94 GHz Amplifier Module With Efficient Suppression of Parasitic Substrate Effects, Tessmann et al, IEE Microwave and Wireless Components Letters, Vol 14, No 4, April 2004. As the flip-chip techniques involves positioning the device upside down onto a substrate, once so bonded it is difficult to get access to the device for subsequent analysis, manipulation or modification, so the technique is not suitable for all situations. There are also problems associated with maintaining the designed electrical performance, such as the frequency characteristic, when the device is flipped over.

UK Patent Application No 0128208.6 describes a shielding means for electromagnetic interference, wherein a cavity employs a divider wall mounted on a lid, the wall effectively separating the cavity into smaller parts. The wall is positioned and shaped so that separate components within the cavity are effectively isolated from each other. This approach loses its effectiveness if sensitive components are mounted very close to radiating components.

SUMMARY OF THE INVENTION

It is an object of the present invention to at least mitigate the problems of the prior art.

According to a first aspect of the present invention there is provided a package for a high frequency electrical circuit comprising a cavity formed within a material for containment of the electrical circuit, characterised in that the package additionally comprises of a material having at least one surface extending into the cavity, the or each surface having thereupon a conductive material, the conductivity thereof being adapted to be at least partially absorbent to electromagnetic radiation.

The cavity may comprise, in addition to any electrical circuitry, a volume at least partially containing a gas such as air, or a dielectric material, or a vacuum. The conductive surface may be a surface on the dielectric material.

The conductive surface may be a surface of an elongate, thin material, the form of the material therefore resembling a vane. The material may comprise a dielectric onto which is coated the conductive surface. This may provide mechanical support to the conductive surface. Alternatively, the conductive surface may be a surface of a larger bulk material such as a dielectric material or a conductive material. The surface may, in this case, be an external surface of the bulk material, or may be an internal surface, such that the conductive surface itself is entirely surrounded by a solid dielectric material.

It has been found that the conductive surface material extending into the cavity tends to reduce any electric field present in the cavity, as the electric field will induce currents in the conductive material, and be at least partially dissipated as heat. Preferably the conductive material is arranged to have a specific resistance arranged to couple E-fields present in the package to the conductive material. The specific resistance of the conductive material may advantageously be arranged to substantially match the impedance of the electric field that would be otherwise expected to exist in the package if the conductive material were not present. This increases the efficiency of the absorption of the electric field by the conductive material.

A further effect of the invention, in addition to the absorption of power in the conductive surface, is a low-order mode cut-off effect, whereby the conductive surface acts, at least partially, to make the cavity in which it is mounted appear to be smaller in size. This can be beneficial due to the nature of field propagation in a cavity. A field propagation pattern within a cavity is termed a mode. The modes that can exist in a cavity are dependent upon the cavity dimensions with respect to the wavelength of propagation of the radiation within the cavity, with the cavity size putting an upper bound on the wavelength that can be maintained in a mode. Thus, a conductive surface applied to a package according to the current invention can make the cavity within the package appear smaller than it is as far as radiation within the cavity is concerned, and so prevent a mode from propagating within the cavity. If this mode is the only one that could otherwise exist, due to the cavity dimensions and wavelength of operation, then the total radiated energy within the cavity will be significantly reduced. If dielectric materials are used as herein described in implementing the invention, then the package will appear electrically to be larger than the physical dimensions. This is due to the shortening of the wavelength of electromagnetic fields within a dielectric of increased dielectric constant. These effects are preferably taken into account when considering the design of any dielectric material used to support the conductive surface.

The conductive surface may be planar, or may take any other suitable form. In particular, it may be of a shape to match in some way that of the cavity into which it impinges. The conductive surface may advantageously take a cylindrical form such as the surface of a hole formed in a dielectric material, with the conductive surface being a coating applied to the wall of the hole. Other forms may be suitable for the conductive surface, such as curves, or a plurality of planar surfaces having differing orientations, which may be adapted to match in some way the arrangement of the electrical circuits within the cavity.

There may be a plurality of conductive surfaces arranged within a single electrical package. This is particularly advantageous when the cavity within the package is large relative to the wavelength of operation. Such cavities will tend to have more complex modes present, which may be easier to suppress using a plurality of suitably spaced conductive surfaces. If desired, the relative size and spacing of the conductive surfaces may be arranged to suppress some modes whilst allowing other modes to exist in the cavity. The or each conductive surface is preferably arranged to lie in the cavity at a position where a relatively high electric field strength is known or expected to be formed. Such positioning will lead to an increase in absorption efficiency of any propagated electric field.

The material comprising the conductive surface may be directly connected to an inner surface of the package, or alternatively may be indirectly connected by means of attachment via a supporting material on which it is formed, such as a dielectric material. The plane of the conductive surface may be arranged to be substantially normal to the package surface on which it is mounted.

The material forming the conductive surface may be mounted on a dielectric as described above, or alternatively the material may be made an appropriate thickness such that it is strong enough to be attached to an inner surface of the package with no additional mechanical support.

If the conductive surface and its support takes the form of a vane then this vane will typically comprise a sheet consisting of one or more materials, which is attached to or otherwise forms part of a package by a connection to an inner surface of the package along an edge of the sheet. The vane may be formed from any suitable material. In particular, the vane may be made from a material that is itself conductive, but is preferably made from a dielectric substrate having a major surface onto which is formed a conductive layer. Such a conductive layer may be applied to part or all of the substrate. The substrate is preferably made from a low dielectric material. Alumina quartz, plastic, cardboard and glass are suitable, amongst others. The conductive material may be nichrome, or a carbon based material such as carbon film, or any other suitable material.

The conductive surface is preferably positioned or mounted on an easily removable portion of the package, such as a lid of the cavity. This allows the conductive surface to be conveniently inserted into the cavity volume by fitting or otherwise positioning the lid or other removable portion onto the package. This allows for convenient modification or replacement so that optimum results can be achieved for differing electric field distributions within the package. The conductive surface may alternatively be positioned or mounted on a fixed surface of the cavity such as a side-wall.

The conductive surface may be formed so as to be an integral part of the package, and so in part comprise the same material that makes up the package, or may be mounted or attached to the package directly or indirectly as a separate process. The conductive surface may be mounted such that it is in electrical connection with the surface to which it is mounted. It may be mounted to the package using any suitable means, such as by epoxy, which may be, but need not be, conductive, or, in the case of a vane, by using a friction fit into a slot in the package, although any other suitable means may be employed.

The resistance properties of the conductive material may be chosen based upon calculated or estimated impedance values for specific package and electrical characteristics, and the intended frequency of operation. Such calculation or estimation may be done analytically or numerically, and is preferably performed using a computer modelling tool, but may alternatively be performed using a trial and error approach. It has been found that good results may be obtained without the need for the specific conductivity to be exactly matched to the impedance of the radiation within the cavity, and that significant improvements in circuit performance can be obtained even if there is some mismatch between the two. Thus the invention lends itself well to a trial and error approach to making a package.

The package may be made from any suitable material, such as a milled metallic material. It may also be made from a non-conductive material, wherein preferably the inside surfaces of the package comprise an electrically conductive layer. A package may also be formed by making a cavity inside a dielectric material, wherein conductive walls are provided by means of a plurality of electrically conductive via holes. If the via holes are spaced suitably closely given the wavelength of operation then they will act as a continuous conductive surface at these wavelengths. Such conductive layers applied to the inside surface of the package are likely to have different conductive properties to that of the conductive surface according to the current invention.

According to a second aspect of the current invention there is provided a vane for suppressing cavity mode radiation and suitable for mounting within a package for a high frequency electrical circuit, the vane comprising at least in part a layer of conductive material, the conductivity thereof being adapted to be at least partially absorbent to electromagnetic radiation.

The vane preferably comprises a substrate on which is mounted a conductive layer as detailed above.

The vane is preferably mounted by an edge thereof to an inner surface of the package.

According to a third aspect of the current invention there is provided a high frequency electrical circuit mounted within a cavity in a package, wherein the cavity has an inner surface on which is positioned a material having a conductive surface extending into the cavity, the conductivity thereof being adapted to be at least partially absorbent to electromagnetic radiation. The conductive surface is as described in relation to other aspects of the invention above.

According to a fourth aspect of the current invention there is provided a method of manufacturing a package for a high frequency electrical circuit, comprising positioning a conductive surface on an inner surface of the package, the conductive surface extending into the package, and the conductivity thereof being adapted to be at least partially absorbent to electromagnetic radiation.

DESCRIPTION OF THE FIGURES

The invention will now be described in more detail, by way of example only, with reference to the following Figures, of which FIG. 1 diagrammatically illustrates an amplifier packaged in a cavity in a known manner.

DESCRIPTION OF A PREFERRED EMBODIMENT

Figure 1:
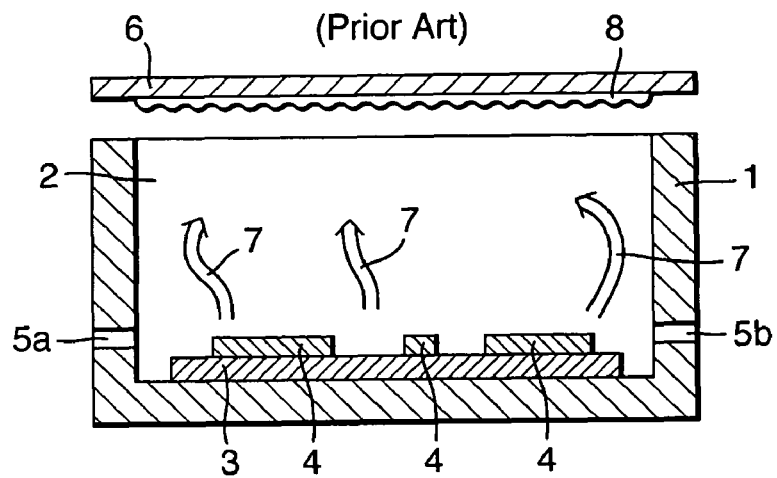

FIG. 1 shows a cutaway side view of a typical package used to hold high frequency electronic circuits. These packages are often made from aluminium blocks, with cavities milled into the block to contain the circuits. An aluminium block 1 contains a cavity 2 into which a substrate 3 is mounted that itself has mounted thereon high frequency electrical components 4, that together form an electric circuit. Holes 5a, 5b in the block 1 are provided for signal entry and exit, and for other purposes if necessary, such as power supply connections. A lid 6 made from aluminium sheet is shown detached from the block 1 for clarity but would, of course, be fixed down to the block 1 when the circuit 3, 4 is operational.

In operation, by the nature of electrical circuits, electromagnetic radiation 7 will be radiated from the circuits 3, 4 themselves into the cavity 2. This radiation can couple into a cavity mode, and thence to other parts of the circuit to another part, and so cause undesirable circuit behaviour. A known method of suppressing such radiation 7 is to attach to a part or all of the underside of the lid 6 a radiation absorbing material (RAM) 8. The RAM 8 attenuates the level of reflection of the radiation 7 from the lid 6, and so reduces the energy available to be coupled back into the circuits 3, 4. However, as the frequency of operation increases this method becomes less effective. The attenuation is not perfect, and losses in the RAM tend to decrease with frequency, and the impedance presented may not provide the optimal conditions for attenuation.

FIG. 2 illustrates the formation of modes within packages of the type illustrated in FIG. 1. It shows the results of a computer simulation of the mode formation at three spot frequencies of a simple passive microwave circuit in a cavity 200 of dimensions 6.6 mm×4.52 mm×1.0 mm. The simulated circuit comprises of two ports 201, 202, each associated with a transmission line (not shown) directed towards the centre of the cavity, each transmission line terminated in an open circuit, but each also having a conventional matching stub (not shown).

Figure 2A:
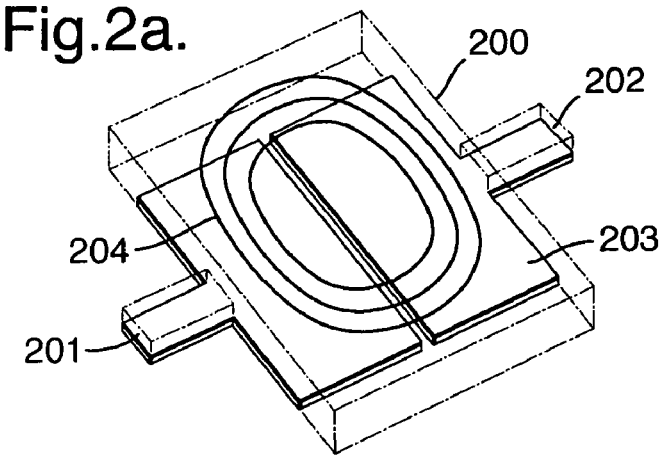
FIG. 2 diagrammatically illustrates the formation of modes of electromagnetic radiation within a cavity.

FIG. 2a shows the mode formation at the first resonant frequency of the cavity at 38.1 GHz. The lines 204 represent lines of equal electric field strength, with the smaller loops indicating a higher field strength. These show the electric field coming to a single peak in the centre of the cavity 200.

Figure 2B:
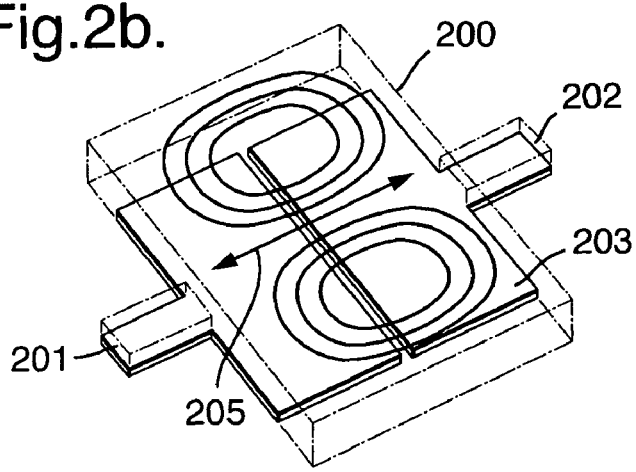

FIG. 2b shows the mode formation at the second resonance of the cavity, at a frequency of 53.9 GHz. It can be seen that there are now two electric field peaks within the cavity 200, formed symmetric about the cavity centre, with a field null 205 running down the centre of the cavity 200.

Figure 2C:
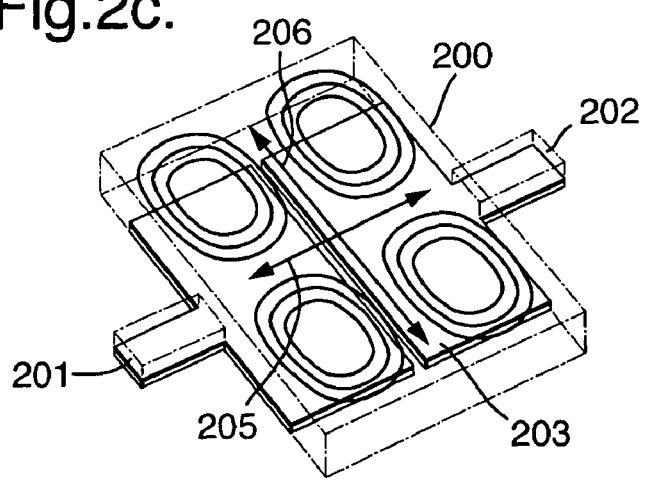

Such mode formations continue to develop as the frequency increases. FIG. 2c shows the fifth resonance of the cavity, at 76.6 GHz. Four e-field peaks are formed, with null regions 205, 206 running through the centre of the cavity in two directions.

A practical system is likely to be operating at frequencies other than those of the exact resonances shown above, and so the e-field patterns generated by such operation will generally be more complex, and dynamic. However, FIG. 2 does show the fields that tend to be formed and, by doing so, cause the coupling problems described herein.

The e-field patterns of FIG. 2 are shown to illustrate the problem to be solved

Figure 3:
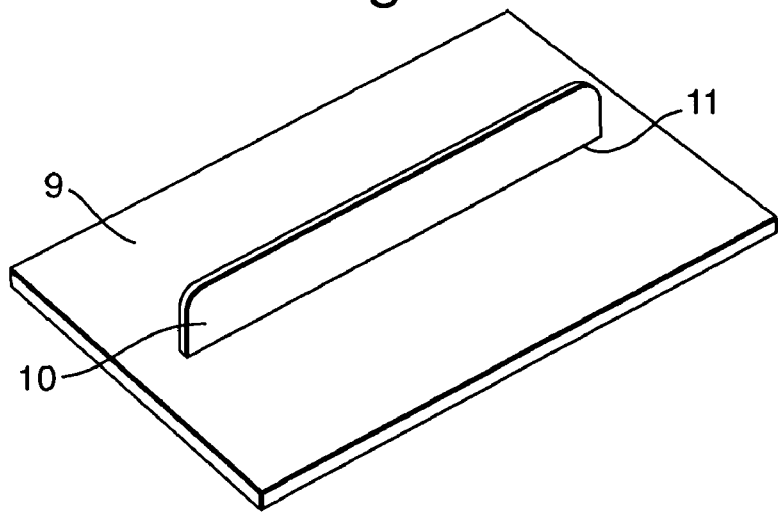
FIG. 3 diagrammatically illustrates a first embodiment of the current invention, with a single conductive surface in the form of a vane mounted on an electric circuit package lid.

FIG. 3 shows a first embodiment of the current invention. Here, a lid 9 is shown that has mounted upon it a conductive surface in the form of a vane 10. The vane 10 is fixed by means of conductive epoxy into a slot at edge 11. The vane 10 is made from alumina, and is coated with a conductive film of nichrome. The lid 9 would, in practice, be mounted onto an aluminium block (not shown in this figure) such that the vane 10 is within a cavity formed within the block.

Figure 4:
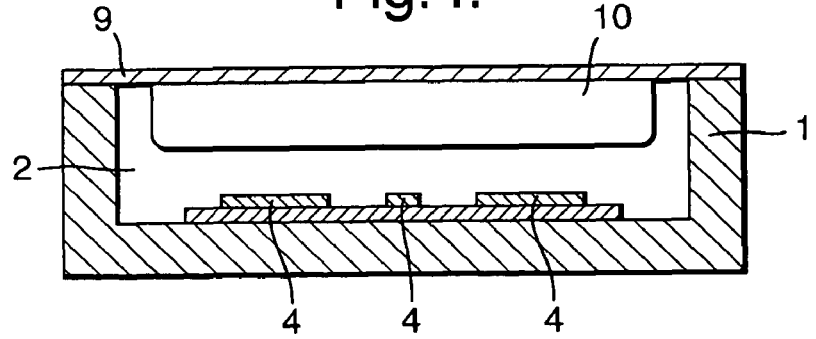
FIG. 4 diagrammatically illustrates a sectional view of an electric circuit package with lid fitted, according to the current invention.

FIG. 4 shows a lid such as that shown in FIG. 3 mounted on a package. Lid 9 with vane 10 attached thereto is positioned on top of a block 1 that is similar to that shown in FIG. 1. In practice, the cavity 2 is likely to be relatively shallow such the bottom of the vane 10 is close to the electrical circuits 4—the Figure is not to scale. A gap of between 50μm and 100μm between the bottom of the vane and the electrical circuit has been found to work well, although good performance may be achieved using other gap dimensions. The vane 10 or other such conductive surface will generally be positioned within the cavity 2 so as to maximise energy absorption from the cavity. This position can often be found by modelling the physical and electrical characteristics of a cavity at the frequencies of interest as has been done as shown in FIG. 2. For example, should the modelling show a single dominant e-field peak in the centre of the cavity similar to that of FIG. 2a, then a vane positioned centrally in the cavity would be sensible.

Figure 5:
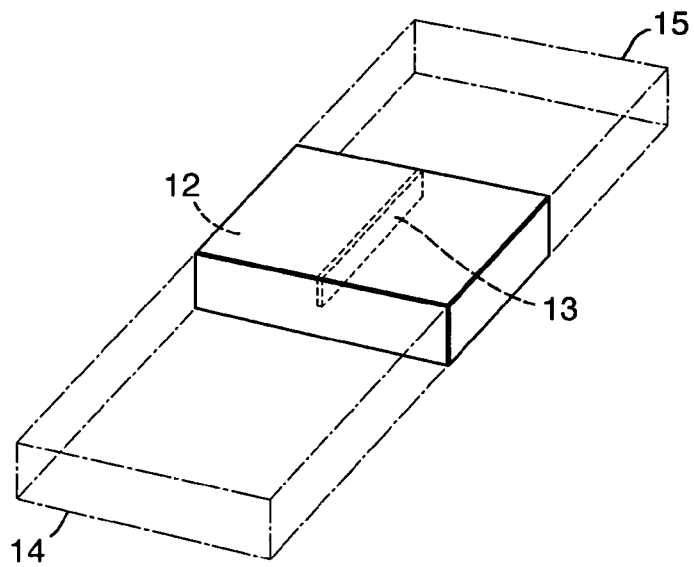
FIG. 5 diagrammatically illustrates a representation of an electric circuit package with a single vane as used for computer modelling experiments.

Embodiments of the current invention and cavities to which they may be applied, including the cavity shown in FIG. 2 have been simulated using the software package HFSS®. This is a simulation package written by Ansoft, and uses finite element techniques to calculate and graphically display basic electromagnetic field quantities. This particular simulation package is not intended to take into account elements having gain, and so a plain cavity having rectangular cross section and having no sources within it was used as the reference for all simulations of the invention as described in this specification. FIG. 5 shows a shows a cavity 12, with a conductive surface applied to a vane 13 mounted centrally to an upper surface of the cavity. Dotted sections indicate waveguide ports 14, 15 that facilitate the simulation of the coupling of energy into and out from the cavity 12. The simulation setup allowed many parameters to be varied, and the effects measured. Parameters varied were vane substrate material and thickness, the conductivity and thickness (together defining the sheet resistance) of a conductive film applied to the substrate, and the frequency of operation.

Vane substrate dielectric constants used in the simulation have taken the values shown in table 1:

TABLE 1

| $\epsilon_r$ | Simulating material: |
|---|---|
| 1 | No substrate |
| 3 | Quartz |
| 10 | Alumina |

An important measure is the power absorbed, by the conductive surface of the vane, of the energy transmitted between the ports 14, 15. It has been found that the various dielectric constants used in the simulation had only a minor effect upon the power absorption of the vane The higher dielectrics were found to increase the absorption slightly, which may be expected due to the additional field concentration that would result in the vane substrate.

It was also found that the change in power absorption with input frequency was also not large. When the simulation was run over the range 70-90 GHz the power absorption varied from approximately 65% to approximately 70% at the best coating conductivity simulated. The primary reason for this variation with frequency is that the waveguide impedance, and hence the matching of the e-field into the conductive surface of the vane, is frequency dependent.

The sheet resistance of the conductive film on the substrate has been found to have a much stronger effect on the power absorption properties of the vane. EM Radiation radiating within a cavity will establish one or more modes of propagation depending upon the dimensions of the cavity in relation to the wavelength of the propagating radiation (as indicated in FIG. 2), and also the geometry of the excitation. Some or all of these modes may be evanescent modes. The impedance, given by the ratio of the electric and magnetic fields, at a particular point in the cavity will vary according to the modes established in the cavity.

The maximum absorption of power within the vane will take place when the resistance of the vane matches the wave impedance. For a particular rectangular cavity (with no vane present) the magnitude of the wave impedances of some low-order transverse electric (TE) modes—designated as $TE_{nm}$—have been calculated at a frequency of 80 GHz, and are presented in Table 2.

TABLE 2

| $TE_{nm}$ | n = 0 | n = 1 | n = 2 |
|---|---|---|---|
| m = 0 | — | 427 | 1083 |
| m = 1 | 273 | 259 | 226 |
| m = 2 | 116 | 114 | 111 |
| m = 3 | 75 | 75 | 74 |

Thus the conductive surface should ideally be made to match with the appropriate modes within the cavity. However, insertion of objects into a cavity can change the modes supported in the cavity—modes which could be either propagating or evanescent—that takes place. This will apply to the current invention also, whether the conductive surface is used in the form of a vane or as the surface of a larger dielectric. This should be considered when estimating the sheet resistance and thickness of the film to be used to coat the vane substrate.

Figure 6:
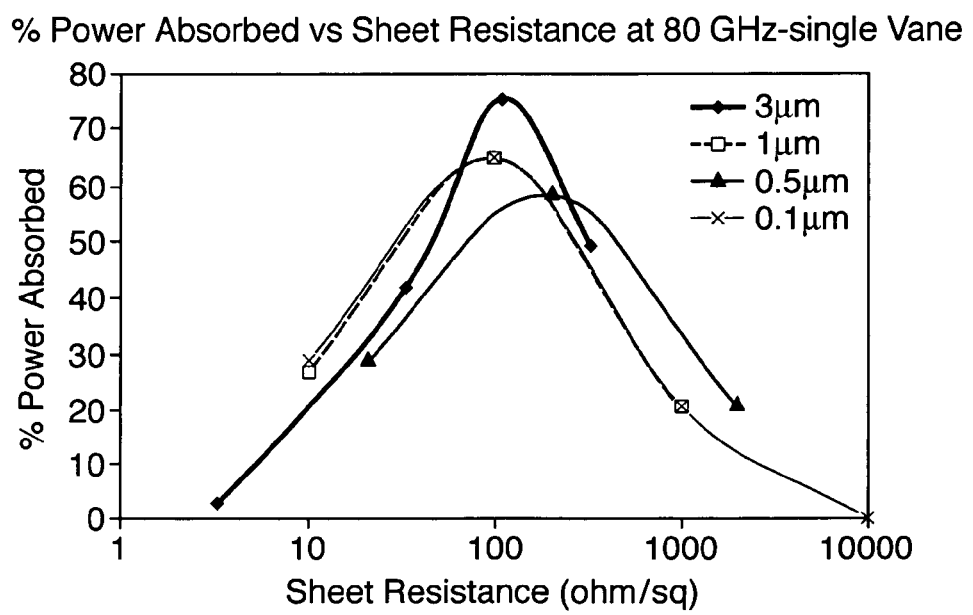
FIG. 6 shows a graph of simulated power absorption properties of a single vane mounted in a package.

FIG. 6 is a graph showing the effects of sheet resistance on power absorbed for the cavity of FIG. 4. The graph shows the percentage power absorbed against the sheet resistance of a conductive film applied to a vane substrate 0.01" (0.254 mm) thick with $\epsilon_r=10$, with a signal frequency of 80 GHz. Four traces are shown, these representing film thicknesses of 3μm, 1μm, 0.5μm and 0.1μm. In all cases the sheet resistance corresponding to the greatest power absorption is between approximately 100Ω/square and 200Ω/square, closely matching the m=2 modes of Table 2. The 3μm film coating is found to be the most efficient absorber.

Figure 7:
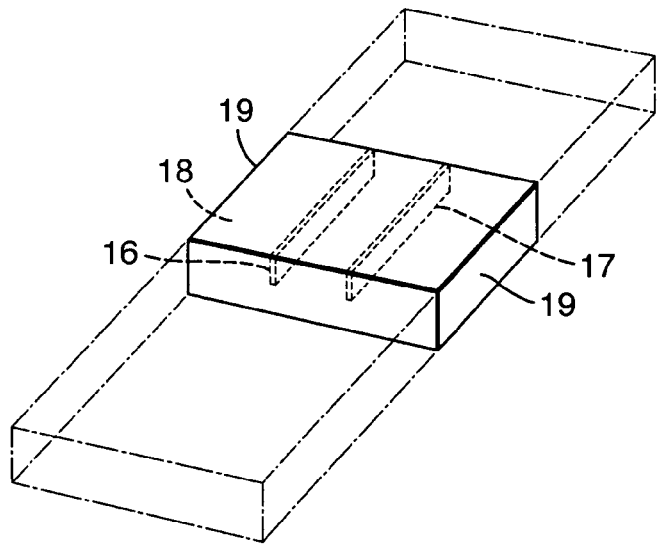
FIG. 7 diagrammatically illustrates a representation of an electric circuit package with two vanes as used for computer modelling experiments.

FIG. 7 shows an embodiment of the current invention employing two vanes 16, 17, mounted within a cavity 18 such that they are equidistant from each other and from the sidewalls 19 of the cavity 18. As there are now two objects in the cavity, this will change the dominant modes within it, and so will also change the impedances of the EM radiation making up the modes.

Figure 8:
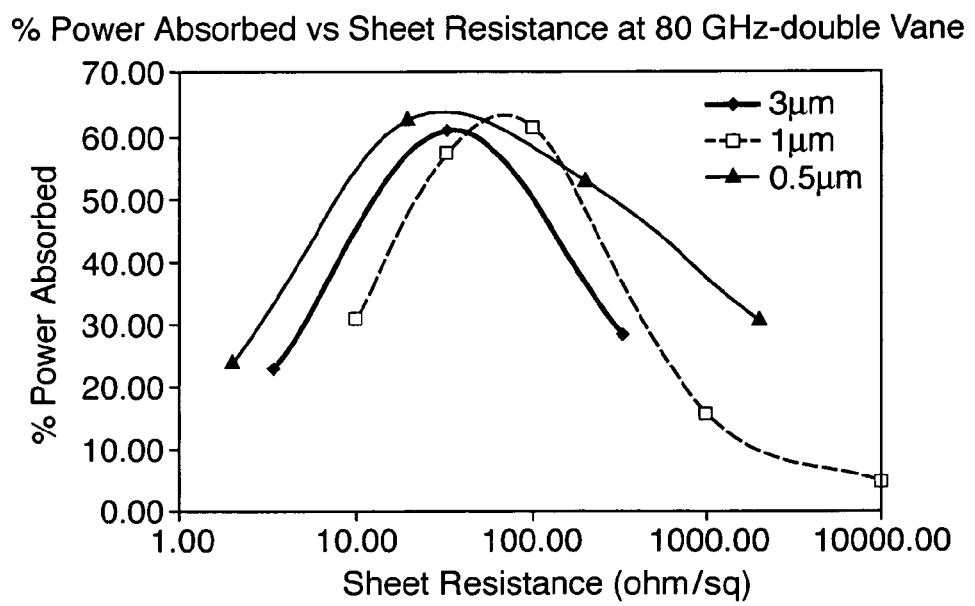
FIG. 8 shows a graph of simulated power absorption properties of a package incorporating two vanes.

A graph of the power absorbed by both vanes 16, 17 against sheet resistance therefore shows, in FIG. 8, a difference in the sheet resistance at which maximum power is absorbed, and the value of the maximum absorption itself as compared to the single vane case of FIG. 6. Sheet resistances of around 50Ω-90Ω/square have been found to be most absorbent consistent with the m=3 modes of Table 2.

The sheet resistance of a film coating used on a conductive surface such as a vane extending into the cavity will, as shown above, affect the power absorption of the vane in a cavity. The film coating can be adapted to enhance the low order mode cut-off effects of the surface, whilst also maintaining an impedance match to cavity modes.

The effectiveness of the current invention is thought to be due to both the impedance matching techniques discussed above, and also a low-order cutoff effect. The skin depth of a material is inversely proportional to the square root of conductivity and operating frequency. The sheet resistance is inversely proportional to conductivity. Hence, by choosing a low conductivity film, a vane can be made which has the desired effective sheet resistance for absorption at the operating frequency. At the same time, if the film is sufficiently thick with respect to the skin depth, this will make the vane act as a metal wall raising the minimum frequency for propagation. If a vane with these properties is placed in the centre of the waveguide it will force the propagating wave into a $TE_{20}$ mode as it passes the vane. If the operating frequency is too low to support the $TE_{20}$ mode it will not propagate. Therefore the vane will act as both an attenuator at high frequencies and as a high pass filter.

Thus the use of a vane having a thicker conductive film made from a material having a lower conductivity will tend to have the properties of a metal wall, so improving the low order mode cut-off, whilst maintaining an impedance match for any modes that are still generated.

It has been found that the farther the vane intrudes into the package cavity the better the vane is at attenuating the radiation. Practical circuits have been made where the conductive surface extends substantially from the top of the cavity to approximately 50μm from the surface of the electrical devices within the cavity. A similar gap is used in all of the simulated results presented herein.

The calculations presented above have all been generated using simulations on a computer system. Quantitative measured results have also been obtained on a cavity of rectangular cross section 2.4 mm×1.3 mm, and these results compared to computer simulations of the same cavity. For ease of measurement this cavity had a port at each end allowing accurate measurements to be made. A vane comprising a sheet of alumina of thickness 0.254 mm (0.01") onto which has been coated a nichrome film of thickness 90 nm was placed in the cavity and measurements made indicative of the absorption and reflection characteristics of the cavity over the frequency range 70 GHz to 110 GHz.

Figure 9:
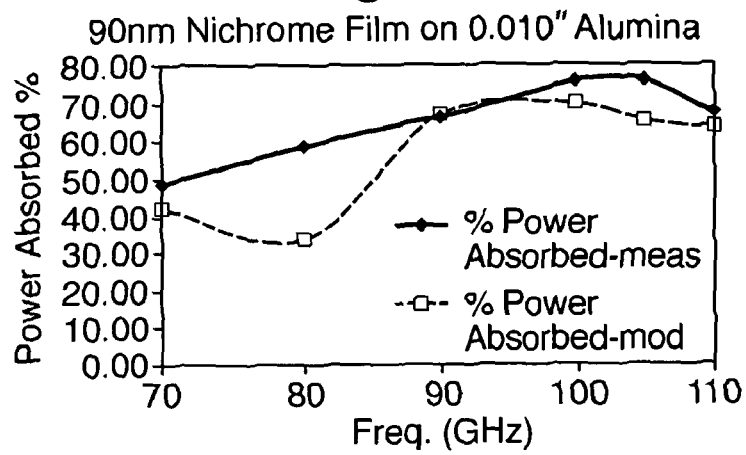
FIG. 9 shows a graph comparing measured and modelled power absorption of a single vane with frequency.

FIG. 9 shows the results for power absorbed by the vane, and also the results of a computer model of the cavity. The results track each other reasonably well, particularly towards the higher frequency end of the graph.

Figure 10:
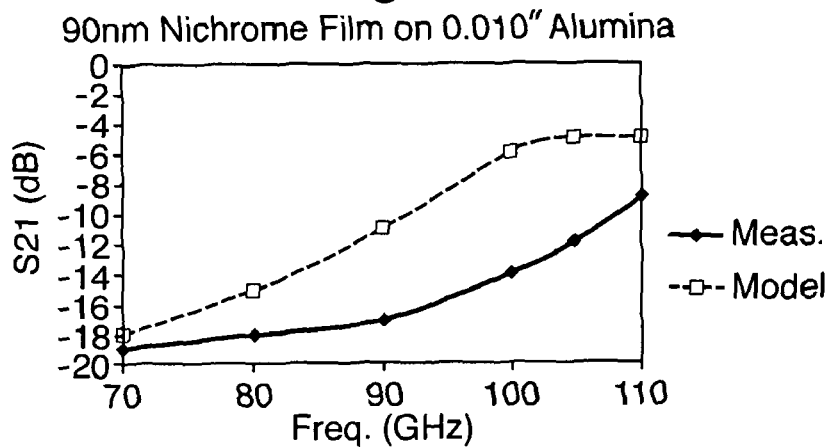
FIG. 10 shows a graph comparing measured and modelled forward transmission ($S_{21}$) of a single vane with frequency.

FIG. 10 shows a plot of the parameter $S_{21}$, or the forward transmission coefficient, for both the modelled and measured cavities. Again, a reasonable agreement is found between the two, especially when it is considered that the parameters are plotted on a logarithmic (dB) scale.

Figure 11:
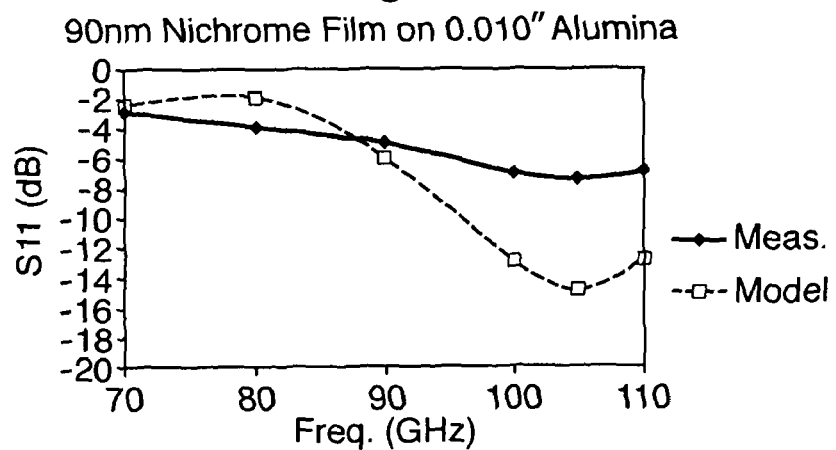
FIG. 11 shows a graph comparing measured and modelled input reflection ($S_{11}$) of a single vane with frequency.

FIG. 11 shows a plot of the parameter $S_{11}$, or the input reflection coefficient, for both the modelled and measured cavities. Again, a reasonable degree of similarity is found between the two, bearing in mind that the parameters are plotted on a logarithmic (dB) scale.

The match between the measured and simulated results indicates the validity of the simulations done on an enclosed cavity as presented in relation to FIGS. 2 to 7.

Figure 12A:
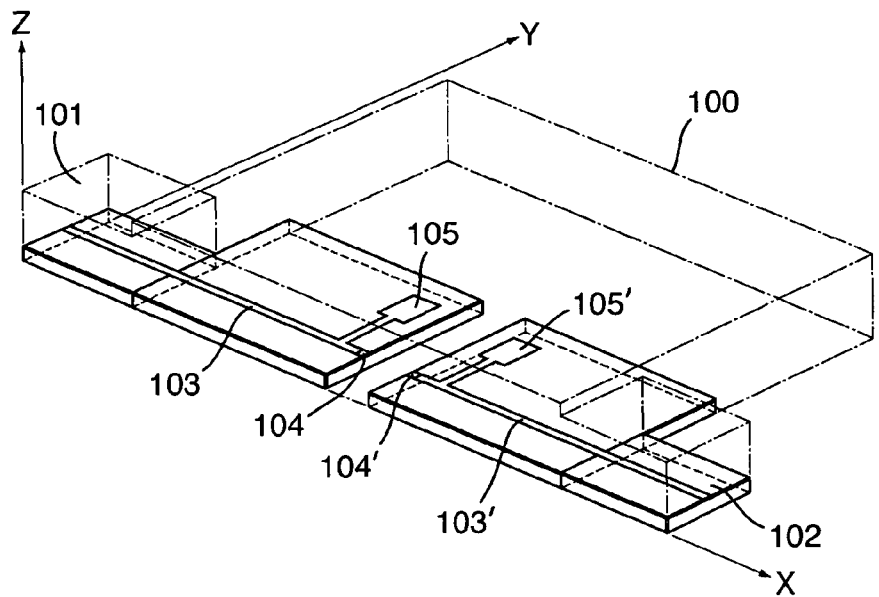
FIG. 12 diagrammatically illustrates a simulated package incorporating electrical circuitry and plots of the transmission and reflectance at ports of the package, the package having no attenuating means.
Figure 12B:
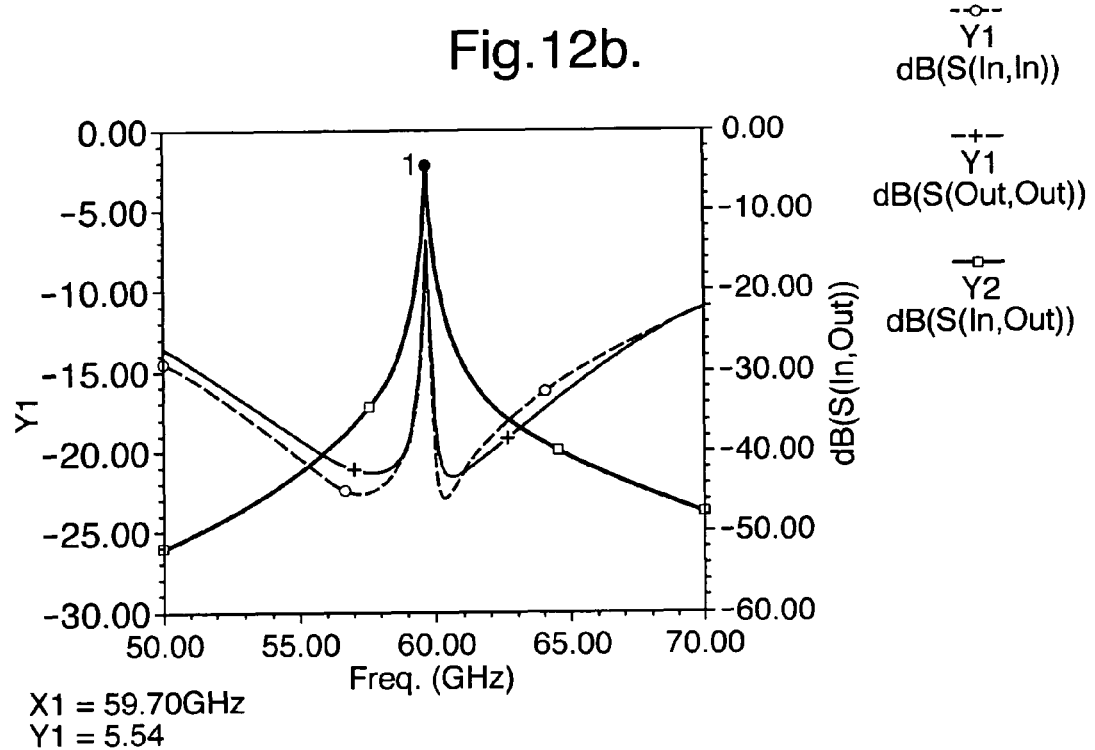

FIGS. 12 and 13 shows quantitatively the improvement that results from using the invention as described herein on a package incorporating electrical components operating at a high frequency. FIG. 12a shows a model of a package 100 which contains two ports, 101, 102. Each port 101, 102 has an electrical circuit comprising a microstrip line 103, 103' terminated with a resistance 104 104' and a bias tee matching stub 105, 105' A gap exists between the circuits relating to each port 101, 102, such that there is no DC connection between the circuits. The package dimensions are 4 mm×3 mm FIG. 12b shows the modelled electrical characteristics of the cavity of FIG. 12a. The trace identified with square markers represents the transmission ($S_{21}$) coefficient between the two ports 101, 102. It can be seen that this peaks at around 60 GHz, where there is only a 5 dB loss between the ports. This transmission is primarily due to cavity mode coupling between the circuits connected to each port 101, 102. The other two traces, marked by circles and vertical dashes, represent $S_{11}$ and $S_{22}$ respectively, and these are seen to have a resonance at the same frequency.

This therefore shows the problem that exists due to cavity mode coupling of electrical circuits. Without the cavity effects there would be very little transmission of energy between the ports.

Figure 13A:
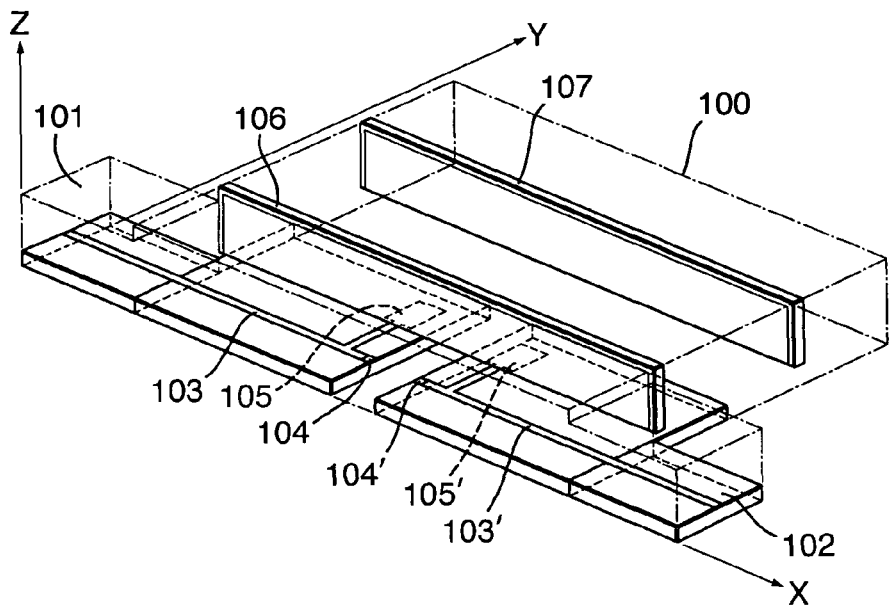
FIG. 13 diagrammatically illustrates the same package and transmission and reflectance plots as that shown in FIG. 11, but this time incorporating attenuating vanes according to the present invention.

FIG. 13a shows the same cavity and circuitry as that shown in FIG. 12a, but this time utilising two vanes 106, 107 according to the present invention on the upper surface of the cavity 100. The vanes were modelled as 100μm thick quartz substrates, with a 70Ω/square conductive coating on a surface of each one.

Figure 13B:
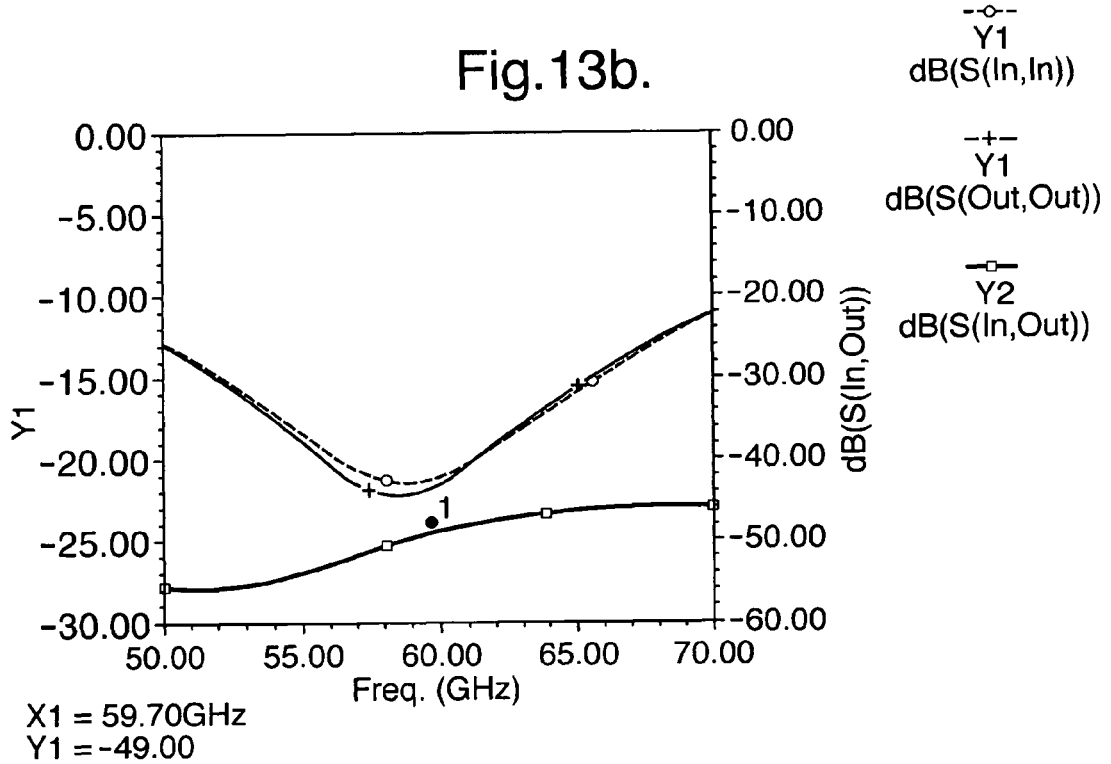

FIG. 13b shows the simulated results for the cavity of FIG. 13a. Again, the trace identified with square markers represents the transmission ($S_{21}$) coefficient between the two ports 101, 102. It can be seen here that by incorporating the vanes 106 107 into the cavity 100 the transmission between the ports 101, 102 has dropped to almost −50 dB. The resonances in the reflectance parameters $S_{11}$ and $S_{22}$ have also been eliminated.

Figure 14:
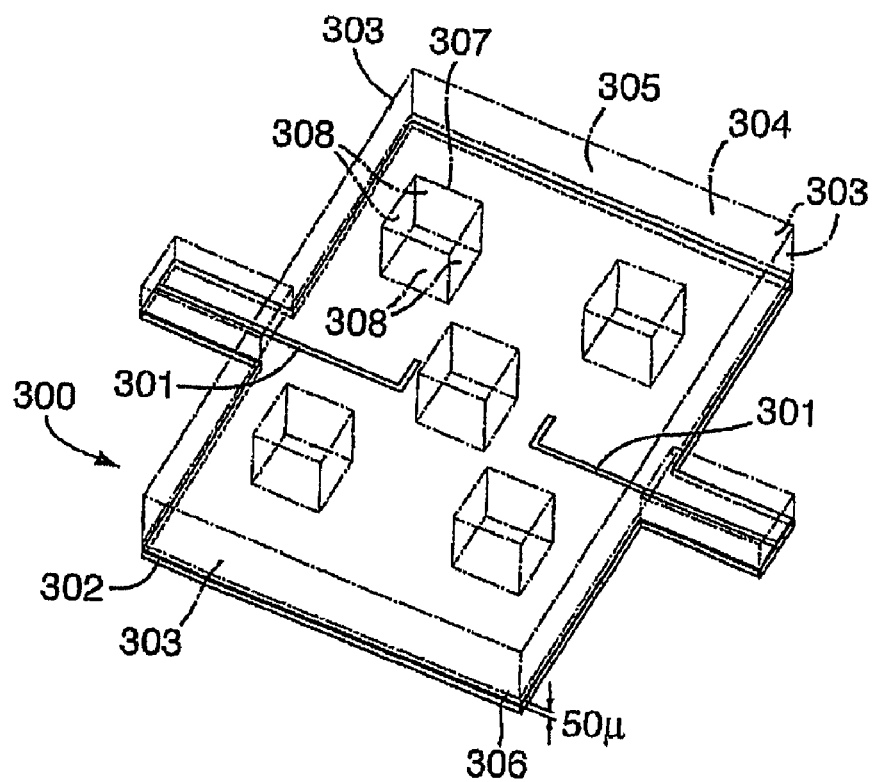
FIG. 14 diagrammatically illustrates an alternative embodiment of the present invention, wherein the conductive surface is implemented on a surface cut into a dielectric slab.
Figure 16:
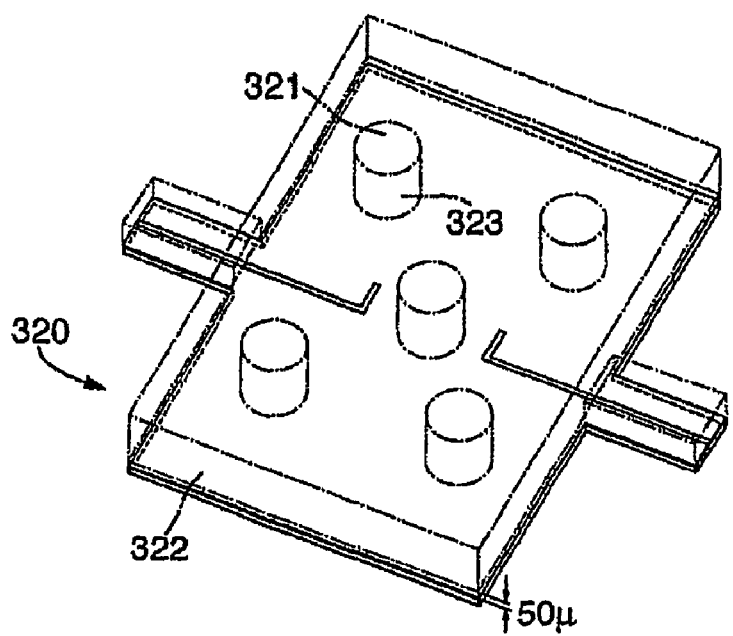
FIG. 16 shows an embodiment 320 similar to that of FIG. 14, with the exception that holes, e.g., 321 let into dielectric slab 322 are of circular cross section, and so define cylindrical surface 323 onto which is coated a conductive surface. Round holes such as those shown may be produced by drilling, or by any other suitable method.

All of the embodiments of the invention described by way of example above have been of a conductive surface applied to a thin dielectric vane. FIG. 14 shows a computer representation of an alternative embodiment for implementation of the conductive surface. A cavity 300 of dimensions 4.52 mm×6.6 mm×1 mm incorporates electronic circuitry on substrate 301 on substrate 302 in a similar manner to those described above. In this case the electrical circuits 301 are simple 50Ω microstrip lines from a first and a second port, each terminated with an open circuit stub near the centre of the cavity 300. Note that all main external surfaces 303, 304 of the cavity 300 are treated as perfectly reflective metallic conductors by the simulation software. The upper surface 304 represents the inner surface of a lid for the cavity 300. A slab 305 of dielectric material of size 4.52 mm×6.6 mm×0.8 mm is mounted on the lid of a cavity such that it largely fills the upper portion of the cavity 300, leaving a 50μm air gap between its lower face and the upper surface of substrate 302 mounted at the base of the cavity.

Positioned in the dielectric material 305 are five square holes 307, each of side length 0.8 mm. The inside surfaces 308 of the holes 307 are each made to be conductive, so as to have a specific resistance matching that of an anticipated electromagnetic field, in a similar manner to that of the vane embodiments described above. The EM field will be largely located within the dielectric material, but will come into contact with the conductive surface 308 on the sides of the holes in the dielectric. If the conductivity and position of the surfaces are chosen appropriately then, as described in relation to the vane embodiment above, the magnitude of the fields present within the cavity will tend to be significantly reduced.

Figure 15A:
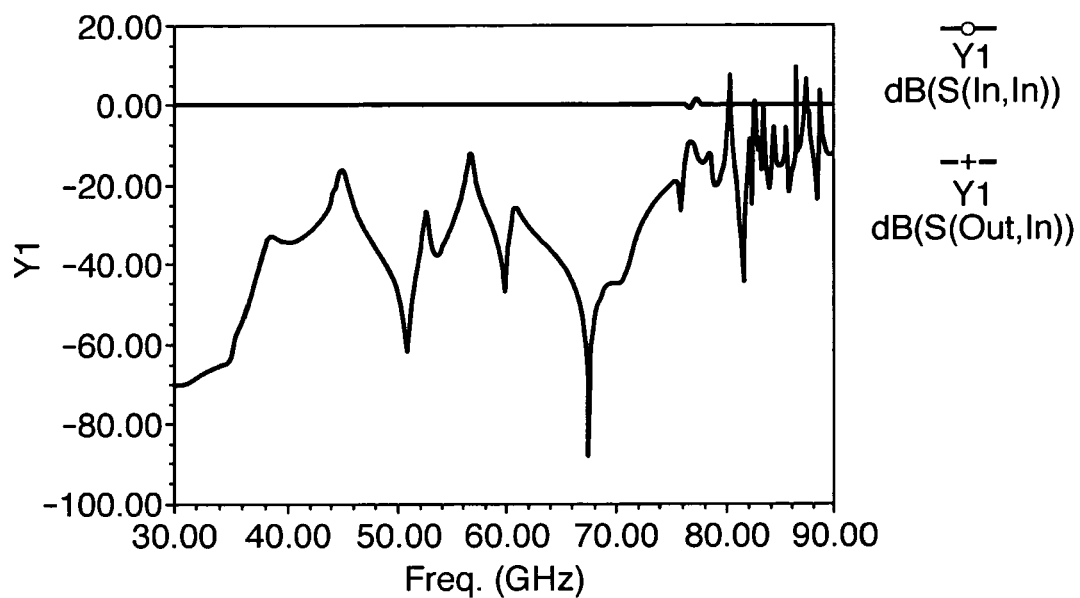
FIG. 15 shows a graph of the results of simulations of the transmission between two ports of the embodiment of FIG. 14, along with a graph of results from a similar cavity not incorporating the conductive surfaces within the dielectric slab.

FIG. 15 shows the effects of the embodiment discussed in relation to FIG. 14. FIG. 15a shows a graph of the transmission from the first to the second port (lower trace), across a frequency band of interest for a cavity in which is mounted a dielectric slab with no holes positioned therein. Thus there are no conductive surfaces as disclosed herein present in the cavity. Significant resonance peaks can be seen at 45 GHz and 56.5 GHz, which may cause problems if active devices such as amplifiers were employed in the cavity. The peaks present at around 75 GHz and above are believed to be artefacts caused by the simulation software rather than an accurate representation of behaviour of the circuit, and can be ignored.

Figure 15B:
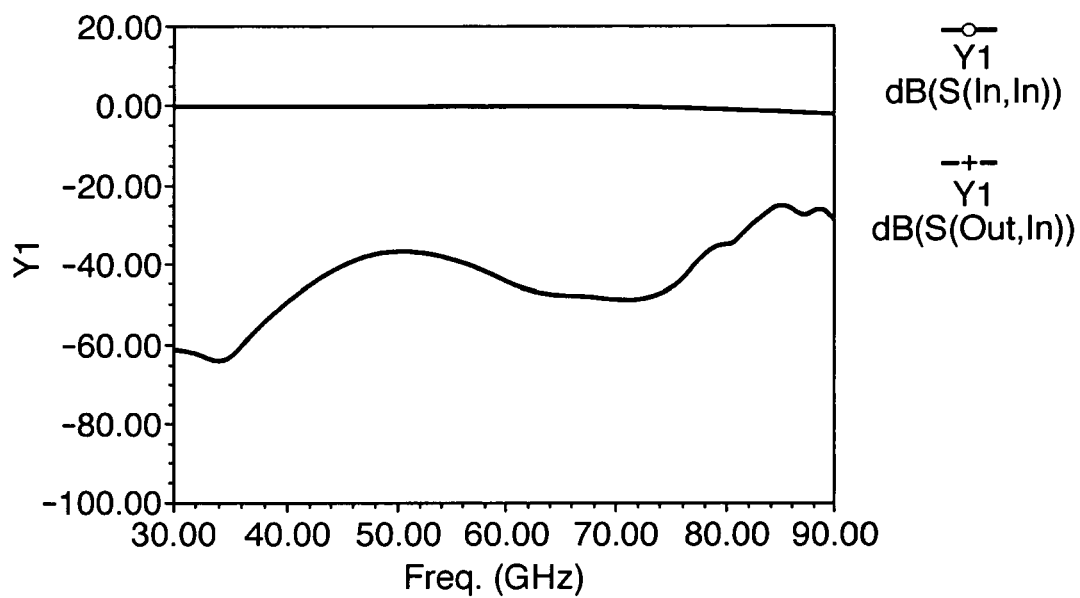

FIG. 15b shows a graph across the same frequency span, of transmission (lower trace) from the first to the second port of a similar cavity, but this time incorporating a dielectric slab having conductive holes as shown in FIG. 14.

It can be seen that the resonant peaks at 45 GHz and 56.5 GHz have completely disappeared, with the transmitted power at these frequencies being over 20 dB down as compared to the previous graph.

The simulation of the embodiment described in FIG. 14 and FIG. 15b used square holes in the dielectric material as this significantly improves the simulation time. However, in a practical system it is more convenient to use round holes, as these can be produced by standard drilling techniques. In practice, there is little difference in performance between the two hole shapes. Of course, other shapes can be used. For example, a slot can be cut into the dielectric and the surface coated with a conductive material to produce a conducting surface similar to that used in the vane embodiments described above. The hole, slot, or other orifice formed in the dielectric material may be conveniently coated by means of filling the orifice with an ink adapted to have desired conductivity characteristics. The currents induced within the conductive material tend to flow only on, or very close to, the surface, and so any additional depth of conductive material will have very little effect on the fields present, over and above the surface effects.

Note that in this specification the terms "electrical" and "electronic", and terms derived from these shall be regarded as synonymous. Further, note that the term "conductive" as applied to a surface extending in to the cavity as described herein includes resistive materials, and so the term should not be limited to materials having extremely high conductivities such as pure metals. In this sense, resistivities of up to 10 k$\Omega$/square, such as up to 1 K$\Omega$/square, such as up to 200$\Omega$/square, such as up to 100$\Omega$/square, such as up to 50$\Omega$/square, such as up to 10$\Omega$/square should all be taken as falling under the term conductive.

The skilled person will be aware that other embodiments within the scope of the invention may be envisaged, and thus the invention should not be limited to the embodiments as herein described.

The invention claimed is:

1. A package for a high frequency electrical circuit comprising a cavity formed within a material for containment of the electrical circuit, wherein the package additionally includes a material extending into the cavity the material extending into the cavity having a conductive region, the conductivity thereof being adapted to provide a resistance arranged to substantially match the wave impedance of an electromagnetic field that would be otherwise expected to exist in the package if the conductive material were not present.

2. A package as claimed in claim 1 wherein the material extending into the cavity comprises a layered structure with a first layer comprising a substrate and a second layer comprising a conductive material.

3. A package as claimed in claim 2 wherein the substrate comprises a material chosen from alumina, quartz, plastic, glass and cardboard.

4. A package as claimed in claim 2 wherein the substrate comprises a dielectric occupying a substantial region of the cavity.

5. A package as claimed in claim 4 wherein the substrate is perpendicular to at least one wall of the package, the substrate having thereupon the conductive material.

6. A package as claimed in claim 1 wherein the material having the at least one conductive region takes the form of a vane.

7. A package as claimed in claim 1 wherein at least one region of the conductive material is arranged to have a specific resistance substantially similar to the impedance of a predicted electromagnetic field that will be present when the cavity is in use.

8. A package as claimed in claim 1 wherein the conductive material has conductivity properties different to that of other parts of the cavity.

9. A package as claimed in claim 1 wherein the package is designed to house circuitry operative in at least one of the millimeter wave and sub-millimeter wave region.

10. A package as claimed in claim 1 wherein the material extending into the cavity is mounted on a removable portion of the package.

11. A package as claimed in claim 1 wherein the material extending into the cavity is mounted such that it is substantially normal to the surface on which it is mounted.

12. A package as claimed in claim 1 wherein the at least one conductive region is mounted in a substantially symmetric fashion within the cavity in relation to a pair of opposing walls of the package.

13. A package as claimed in claim 1 wherein the material extending into the cavity is substantially planar.

14. A package as claimed in claim 1 wherein the conductive material comprises nichrome.

15. A package as claimed in claim 1 wherein the conductive material comprises carbon.

16. A package as claimed in claim 1 wherein at least one conductive region is substantially cylindrical.

17. A package as claimed in claim 1 wherein the region having thereupon the conductive material resides in a slot located in a dielectric material in the cavity.

18. A package as claimed in claim 1 wherein the conductive material resides in a hole located in a dielectric material cavity.

19. A package as claimed in claim 18 wherein the hole has a cylindrical form.

20. A package as claimed in claim 1 wherein the conductive material takes the form of an ink.

21. A vane for suppressing cavity mode radiation and suitable for mounting within a package for a high frequency electrical circuit, the vane comprising at least in part a layer of conductive material, the conductivity thereof being adapted to provide a resistance arranged to substantially match the wave impedance of an electromagnetic field that would be otherwise expected to exist in the package if the conductive material were not present.

22. A vane as claimed in claim 21 wherein the vane comprises a substrate upon which is arranged the conductive material layer.

23. A vane as claimed in claim 21 wherein the vane is mounted to an inner surface of the package by being affixed substantially along an edge of the vane.

24. A vane as claimed in claim 21 wherein the vane is mounted to an inner surface of the package by being affixed within a slot in the inner surface.

25. A high frequency electrical circuit mounted within a cavity in a package, wherein the cavity has an inner surface on which is positioned a material having a conductive surface extending into the cavity, the conductivity thereof being adapted to provide resistance arranged to substantially match the wave impedance of an electromagnetic field that would be otherwise expected to exist in the package if the conductive material were not present.

26. A method of manufacturing a package for a high frequency electrical circuit, comprising positioning a material having a conductive region on an inner surface of the package, the said material having the conductive region extending into the package, and the conductivity thereof being adapted to provide resistance arranged to substantially match the wave impedance of an electromagnetic field that would be otherwise expected to exist in the package if the conductive material were not present.

27. A method as claimed in claim 26 wherein the conductivity of the conductive region is chosen by one of: simulation of expected electrical properties of circuitry within the package, and a trial and error approach.

28. A package for a high frequency electrical circuit comprising a cavity formed within a material for containment of the electrical circuit, wherein the package additionally includes a material extending into the cavity, the material extending into the cavity having at least one conductive region, the conductivity thereof being adapted to provide resistance arranged to substantially match the wave impedance of an electromagnetic field that would be otherwise expected to exist in the package if the conductive material were not present , with the conductive region having a resistivity of between 10Ω/square and 1kΩ/square.

29. A package as claimed in claim 28 wherein the material extending into the cavity comprises a layered structure with a first layer comprising a substrate and a second layer comprising a conductive material.

30. A package as claimed in claim 29 wherein the substrate comprises a dielectric occupying a substantial region of the cavity.

31. A package as claimed in claim 28 wherein the material having the at least one conductive region takes the form of a vane.

32. A package as claimed in claim 28 wherein the region having thereupon the conductive material resides in a slot located in a dielectric material in the cavity.

33. A package as claimed in claim 28 wherein the conductive material resides in a hole located in a dielectric material in the cavity.

34. A package for a high frequency electrical circuit comprising a cavity formed within a material for containment of the electrical circuit, wherein the package additionally comprises a dielectric material extending into the cavity and occupying a substantial region thereof, the dielectric material extending into the cavity incorporating a resistive material on a surface thereof, the resistivity of the resistive material being adapted to provide resistance arranged to substantially match the wave impedance of an electromagnetic field that would be otherwise expected to exist in the package if the conductive material were not present.

* * * * *